United States Patent [19]
Atallah et al.

[11] Patent Number: 5,396,449
[45] Date of Patent: Mar. 7, 1995

[54] FAST CONTENT ADDRESSABLE MEMORY WITH REDUCED POWER CONSUMPTION

[75] Inventors: Francois I. Atallah, Raleigh; Stacy J. Garvin, Durham; David W. Nuechterlein, Durham, all of N.C.

[73] Assignee: International Business Machines Corporation, Armonk, N.Y.

[21] Appl. No.: 171,483

[22] Filed: Dec. 21, 1993

[51] Int. Cl.⁶ .............................................. G11C 15/00
[52] U.S. Cl. ..................................... 365/49; 365/156; 365/189.07
[58] Field of Search ................... 365/49, 154, 156, 190, 365/189.07

[56] References Cited

U.S. PATENT DOCUMENTS

| | | | |
|---|---|---|---|
| 3,969,707 | 7/1976 | Lane et al. | 365/49 |
| 4,646,271 | 2/1987 | Uchiyama et al. | 365/49 |
| 4,823,313 | 4/1989 | Kadota | 365/49 |
| 4,831,585 | 5/1989 | Wade et al. | 365/49 |
| 4,853,892 | 8/1989 | Hori | 365/49 |
| 5,226,005 | 7/1993 | Lee | 365/49 |

FOREIGN PATENT DOCUMENTS

0192098  7/1990  Japan ..................................... 365/49

OTHER PUBLICATIONS

*IBM Technical Disclosure Bulletin*, "High Performance Static Content Addressable Memory Cell." vol. 32, No. 3A. Aug. 1989, pp. 478–479.

*Primary Examiner*—Eugene R. LaRoche
*Assistant Examiner*—Son Mai
*Attorney, Agent, or Firm*—Steven B. Phillips; George C. Clark

[57] ABSTRACT

A content addressable memory in accordance with the present invention includes a number of bistable memory cells having as inputs thereto first and second bit lines and an address line, and a COMPARE circuit connected to each of the memory cells so as to provide the COMPARE function without loading the first and second bit lines and including means for inhibiting current flow when a miscompare occurs.

11 Claims, 4 Drawing Sheets

FAST CONTENT ADDRESSABLE MEMORY WITH REDUCED POWER CONSUMPTION

FIELD OF THE INVENTION

The present invention relates to a content addressable memory and more particularly to a content addressable memory having a number of fast switching cells having reduced power consumption.

BACKGROUND OF THE INVENTION

A content addressable memory (CAM) is a storage device that stores data in a number of cells which can be accessed or loaded on the basis of their contents. A CAM can be used to store and access data according to address location and also determine the address location of presented data. These operations are write, read and search, respectively. The memory can be made more powerful by incorporating additional logic whereby a "don't care" state, as well as the "one" and "zero" states can be presented to the CAM so that certain bits can be masked from the search operation.

All cells are compared simultaneously in parallel, and a single mismatch on any of the cells signals a mismatch for the entire word. With the parallel approach, the data must be stored such that a search operation will not destroy it. The data should be stored on an active device in such a way that when a "mismatch" is presented, the device changes its output while retaining its state.

The storage can be achieved in a number of ways. However, field effect transistor technology is most attractive when density, speed, power dissipation and cost are taken into account.

In prior art CAM cell design there are two bit lines that run through all words in the memory. Those bit lines are used both to carry data to be written into the cells and to present data against which a match is to be made. A Match line runs through the memory connecting an entire word and serves as a wired-OR for mismatches. If any cell in the word mismatches the presented data, the Match line is discharged to a lower potential. The following are several examples of prior art content addressable memory systems capable of high speed operation.

U.S. Pat. No. 3,969,707 to Lane et al. teaches a content addressable memory having a cell with a pair of current switches one at each output to provide for searching the cell at high speed and without disturbing the contents of the cell. The patent does not teach a content addressable memory having reduced power consumption and high speed switching as a result of the improved circuits of the present invention.

An article in the IBM Technical Disclosure Bulletin, Volume 26, Number 10B, March 1984, at page 5364 by Schuster describes a dynamic content addressable memory with refresh feature. The publication presents a space efficient content addressable memory cell which uses five active devices. However, the publication does not teach nor suggest a content addressable memory having high speed switching devices or reduced power consumption as does the present invention.

U.S. Pat. No. 4,646,271 to Uchiyama et al. shows a content addressable memory having dual access modes. The patent basically teaches the use of a single array of cells as either a content addressable memory or a random access memory depending upon which word selection line is activated. The patent does not teach nor suggest increasing switching speed nor reducing power consumption of the content addressable memory as is taught and claimed by the present invention.

U.S. Pat. No. 4,831,585 to Wade et al. teaches a four transistor cross-coupled bit line content addressable memory. The patent describes a content addressable memory cell and the structure thereof in which cross coupling results in reduced degenerative capacitive coupling which improved speed and noise immunity of the cell. However, the content addressable memory of the patent does not teach or suggest how power consumption may be reduced in a content addressable memory as does the present invention.

An article in the IBM Technical Disclosure Bulletin, Volume 32, Number 3A, August 1989, at page 478 by Lipa et al. describes a high performance static content addressable memory cell which has certain similarities to the content addressable memory according to the present invention. However, although the article addresses speed considerations with respect to discharge of the Match line, the article does not teach or suggest reduced power consumption by preventing current flow on a miscompare as does the present invention.

The prior art content addressable memories described above, while attempting to provide solutions to a number of problems in content addressable memory design, such as simplification of design or improved switching speeds by reducing load capacitance, do not provide the combination of improved features of the present invention.

SUMMARY OF THE INVENTION

It is, therefore, a primary object of the present invention to improve switching speed and reduce power dissipation in a content addressable memory.

It is a further object of the present invention to improve these parameters employing a simple design using complementary metal oxide silicon (CMOS) field effect transistors.

These and other objects are achieved by the use of a COMPARE circuit coupled to a bistable memory cell wherein the COMPARE circuit inputs are isolated from the bit lines so as to avoid increased capacitive loading on the bit lines and wherein the COMPARE circuit includes a means for inhibiting DC current flow when a miscompare occurs thus reducing power dissipation in the content addressable memory.

Accordingly, a content addressable memory in accordance with the present invention includes a number of bistable memory cells having as inputs thereto first and second bit lines and an address line, and a COMPARE circuit connected to each of the memory cells so as to provide the COMPARE function without loading the first and second bit lines and including means for inhibiting current flow when a miscompare occurs.

The foregoing and other objects, features, and advantages of the invention will be apparent from the following more particular description of a preferred embodiment of the invention as illustrated in the accompanying drawing in which like reference characters referred to the same parts throughout the different figures.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF A PREFERRED EMBODIMENT OF THE INVENTION

Figure 1:
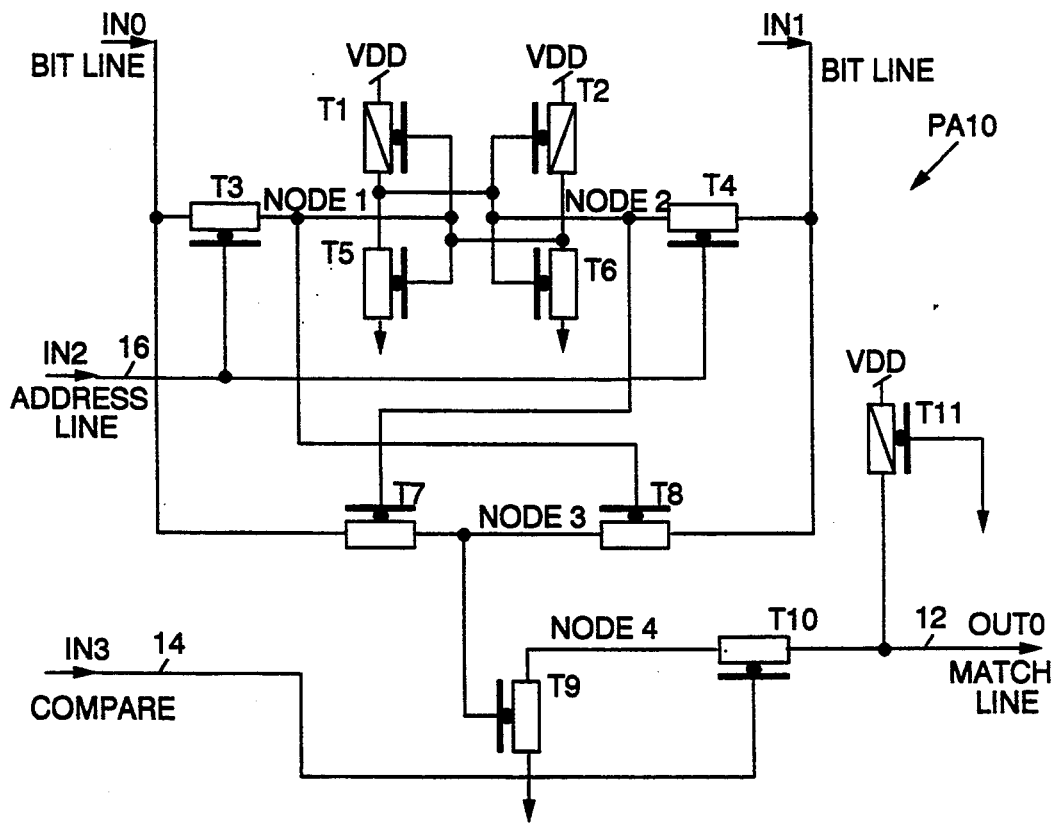
FIG. 1 is a schematic diagram of a prior art memory cell used in a content addressable memory.
Figure 2:
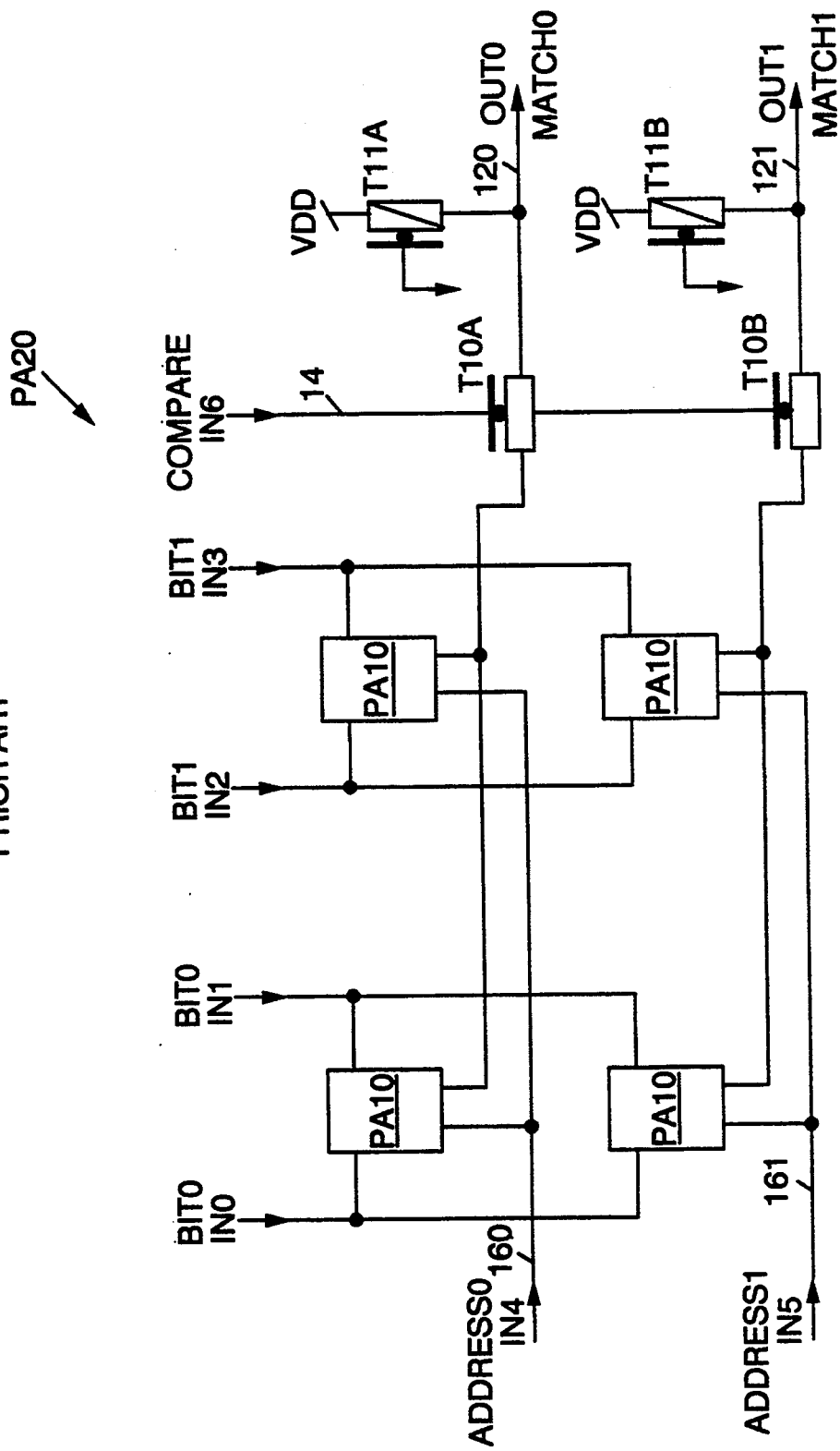
FIG. 2 is a schematic diagram of a four cell memory array of prior art memory cells.

Referring now to FIGS. 1 and 2, a typical prior art content addressable memory PA20 and memory cell PA10 will be described. Devices T1 through T6 inclusive are connected in a circuit which represents a well known random access memory bistable cell similar to that shown in the Lipa et al. IBM Technical Disclosure Bulletin article discussed above. The COMPARE circuit is comprised of devices T7, T8, T9, T10, and T11.

Under the convention used throughout this discussion, a logic High level on match line 12 represents a compare, and a logic Low level on match line 12 represents a miscompare. One of devices T7 or T8 passes either 0 volts which maintains a logic High Level on the Match line 12 resulting in a compare, or +5 volts which discharges the Match line 12, resulting in a miscompare signal.

Although devices T10 and T11 are shown in the diagram, they are not part of the cell. T10 and T11 operate to pre-charge the match line and to shut off the DC current path when the COMPARE function is not activated. There is one pair of devices T10 and T11 for each Match line 12 common to all the cells that share the same address line.

The COMPARE operation in a prior art memory cell of FIG. 1 is as follows:

The COMPARE function is activated by raising COMPARE line 14 to +V (such as 5 volts), and the address line 16 is brought to ground. Data and its complement are applied to bit lines IN0 and IN1. If DATA IN is at +V, IN0 is at +V, and IN1 is at ground. Also, node 1 is at +V, and node 2 is at ground. Device T7 is off, and T8 is on. T8 will pass 0 volts to the gate of T9, thus turning off T9. Having T10 and T11 on, the Match line 12 is held at +V indicating that the DATA IN matches the content of the cell. If node 1 is at ground and node 2 is at +V, then device T7 is on, and T8 is off. Device T7 will pass +V to the gate of T9 thus turning it on. Device T9 will sink all the current that device T11 supplies. It will bring the Match line 12 to ground and will interpret the results as a mismatch of DATA or the content of the cell. The content addressable memory cell of FIG. 1 has several disadvantages. First, the capacitive load which is seen by the bit lines is very high. Bit line capacitance is very critical for the performance of the READ function. When the cell is being read, devices T6 and T4 or their complement devices T3 and T5 have to discharge the bit lines. Since T7 and T8 are also connected directly to the bit lines, the capacitive load seen by bit lines IN0 and IN1 is effectively doubled, thus affecting the performance of the READ function. Additionally, the intermediate node between devices T7 and T8 (node 3) must be discharged.

A worst case delay occurs when device T9 in only one cell is on and tries to pull the Match line 12 to ground. T9 must discharge the total capacitance of the Match line 12 and be able to sink the current that device T11 provides. Unless device T9 is large, the performance is very poor. However, device T9 must be small in order to maintain an acceptable cell size. Also, when the cell is not in the COMPARE function, device T9 is always on and is keeping node 4 at 0 volts. When the COMPARE function is executed, and the contents of the cell matches with the data applied on bit lines IN0 and IN1, T9 shuts off, and device T11 has to pull node 4 to +V. Since device T11 is implemented as a pull up device, its current capacity is very small thus causing node 4 to charge very slowly. This prior art design has several conflicting requirements. For example, device T9 has only a limited range for its current sinking capability. It cannot be so large that it will dominate the Match line 12 and never allow device T11 to pull Match line 12 to +V, but at the same time, T9 must be large enough to pull the Match line 12 to ground in an acceptable amount of time.

Referring to FIG. 2, it can be seen that there is one T10 and one T11 device for each Match line 120, 121 in an array of cells.

Further, power consumption in an array of cells employing the prior art cell of FIG. 1 is excessive since device T11 is always on when executing the COMPARE function, and if a cell miscompares, there is a DC path from the power supply to ground through T11, T10, and T9 which provides unnecessary power consumption.

Figure 3:
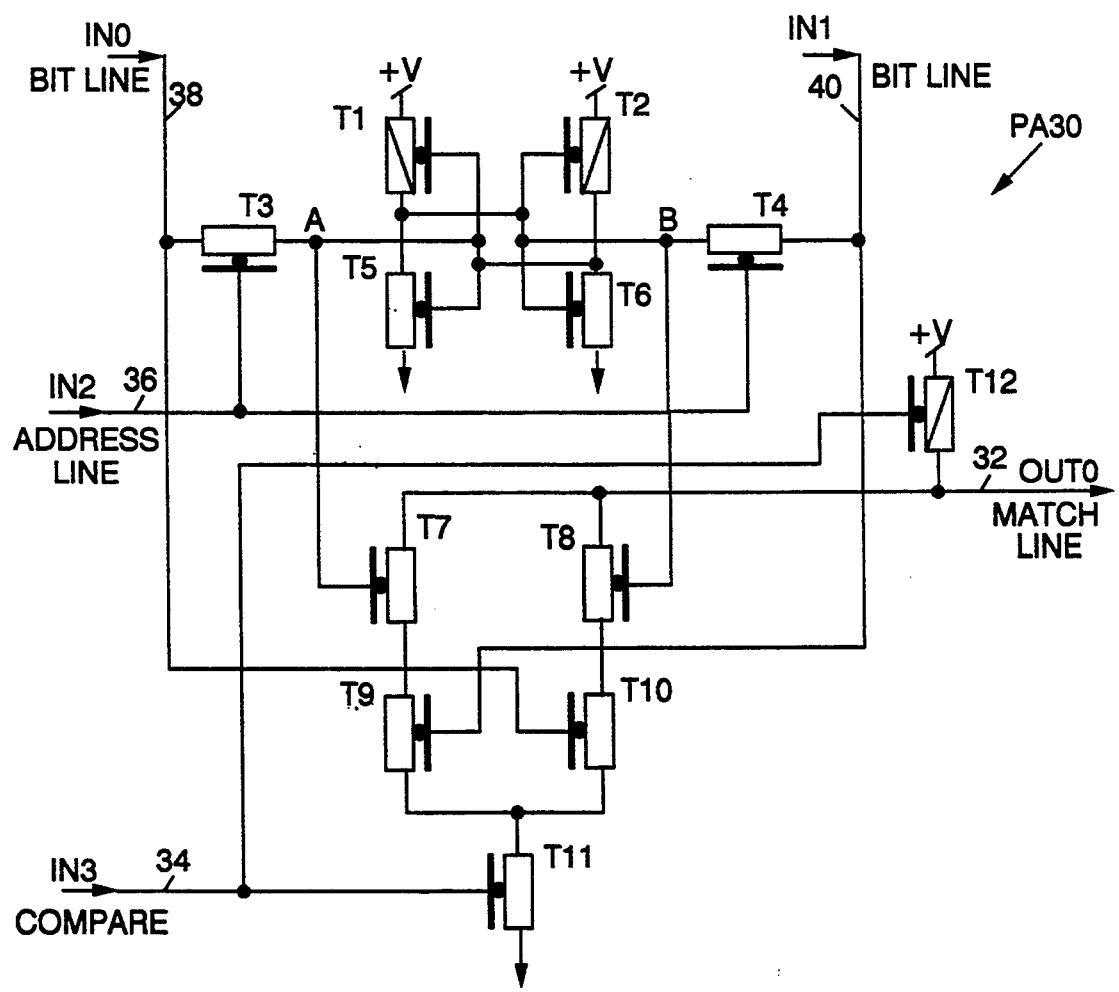
FIG. 3 is a content addressable memory cell in accordance with the present invention.

Referring now to FIG. 3, a content addressable memory embodying the present invention employs memory cells which overcome the deficiencies of the prior art content addressable memories. As can be seen from FIG. 3, the bistable memory cell consisting of devices T1, T2, T3, T4, T5, and T6 has the same configuration as the bistable cell portion of prior art content addressable memory cells. However, the compare circuit of the content addressable memory according to the present invention has been modified to overcome the problems identified above. Since only the capacitances associated with devices T3 and T4 are presented to bit lines IN0 and IN1 respectively, bit lines IN0 and IN1 see a smaller load capacitance and thus are able to switch in less time than was possible with the prior art content addressable memory cells.

To provide the COMPARE function, the gates of devices T9 and T10 are connected respectively to bit lines IN1 (for T9) and IN0 (for T10). The gate of the device T7 is connected to node A, and the gate of device T8 is connected to node B. The source of devices T7 and T8 are connected together and to Match line 32 and also through pull up device T12 to +V. The drain of device T7 is connected to the source of device T9, and the drain of device T8 is connected to the source of device T10. The drains of device T9 and T10 are connected together and to the source of pull down device T11. Device T11 has its drain connected to ground and its gate connected to COMPARE line 34. The gate of pull up device T12 is also connected to COMPARE line 34.

During a COMPARE, the bit lines (gates of T9 and T10) are set according to the data that is being searched (i.e., the gate of T9 may be +V and the gate of T10 is 0). Cell PA30 contains information as to which state it has been previously programmed. If the data in cell PA30 is the same as the data being applied in the search (node A is +V and node B is 0) no charge is drained from the match line since T7 and T10 are unable to conduct. However, if the data in cell PA30 does not match (node A is 0 and node B is +V), then current flows through T8, T10, T11, and the match line is discharged signaling a miscompare.

Prior to executing the COMPARE function, device T11 is OFF and device T12 is ON. The Match line 32 is held at +V, and no current flows since device T11 is OFF. When COMPARE line 34 is turned on, device T11 is turned on, and device T12 is turned off. If a cell miscompares, Match line 32 is discharged to ground very rapidly. If all cells compare, Match line 32 stays charged to +V. Since device T12 is off during a COMPARE operation, no current flows when a cell miscompares, thus reducing power consumption in the cell.

Figure 4:
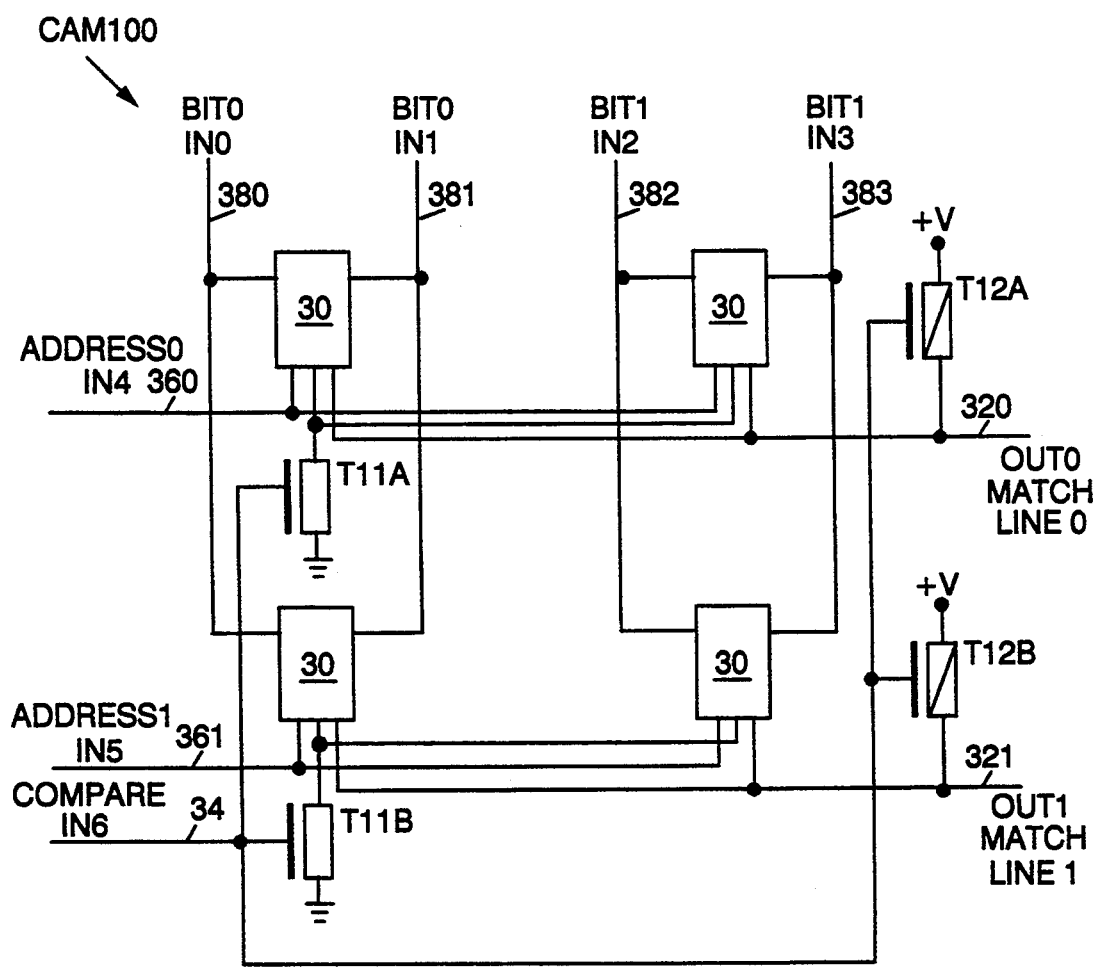
FIG. 4 is a four cell memory array in accordance with the present invention.

Referring now to FIG. 4, content addressable memory CAM 100 will be described. For ease of description and understanding, a simplified array of four content addressable memory cells 30 are shown. Each row of memory cells 30 has data input on input lines 380, 381, 382, 383 respectively wherein bit 0 and its complement are input to the first row on lines 380 and 381 respectively, and bit 1 and its complement are input to the second row on lines 382 and 383 respectively. There is an address line for each column such as ADD0 360 for the first column of memory cells 30 and an ADD1 361 for the second row of memory cells 30.

Also, there is a COMPARE line 34 which is connected to COMPARE gates for devices T11a and T11b. The gates of all of the T11 devices are made active when the COMPARE line 34 is turned on. Each row of cells 30 has an output connected to a Match line 320, 321. The Match line is also connected to a pull up device T12a and T12b respectively.

The COMPARE function operates by comparing the input data on the bit lines 380, 381, 382, 383 with the data stored in the memory cells 30. If any cell in a row does not match the input data on the bit lines, Match lines 320, 321 will be switched to a 0 volt level as described above. If all cells in a row match the input data, Match lines 320, 321 will remain at a high level indicating a match of the row or word.

Although the invention has been described with reference to a preferred embodiment thereof, it will be understood by those skilled in the art that various changes in implementation may be made without departing from the spirit or scope of the invention.

What is claimed is:

1. A content addressable memory, comprising:
    a plurality of bistable memory cells having first and second data input/output terminals connected to first and second data lines and an address terminal connected to an address line;
    a compare circuit connected to each of said plurality of memory cells and having a compare line connected to an input of said compare circuit and having an output of said compare circuit connected to a match line, said compare circuit further comprising:
    first and second switching devices each having a first input terminal connected to said compare line, said first switching device having a second terminal connected to a first voltage reference point, said second switching device having a second terminal connected to a second voltage reference point, said first switching device having a third terminal connected to a common junction of second terminals of third and fourth switching devices, and said second switching devices having a third terminal connected to said match line,
    third and fourth switching devices, each having three terminals, a first terminal of said third device connected to said second data line, a first terminal of said fourth switching device connected to said first data line, a third terminal of said third switching device connected to a second terminal of a fifth switching device, a third terminal of said fourth switching device connected to a second terminal of a sixth switching device; and
    fifth and sixth switching devices, each having three terminals. A first terminal of said fifth switching device connected to an input terminal of said bistable circuit associated with said first data line and isolated therefrom, a first terminal of said sixth switching device connected to an input terminal of said bistable circuit associated with said second data line and isolated therefrom, a third terminal of said fifth switching device and a third terminal of said sixth switching device connected to said match line;
    wherein said memory operates with reduced power consumption, reduced data line capacitance, and with improved switching performance.

2. A content addressable memory, according to claim 1, wherein said first voltage reference point is at ground potential and said second voltage reference point is at an operating supply voltage potential.

3. A content addressable memory, according to claim 1, wherein said first, third, fourth, fifth, and sixth switching devices are N channel field effect transistors, and said second switching device is a P channel field effect transistor.

4. A content addressable memory, according to claim 1, wherein said first and second switching devices are shared with other compare circuits in said content addressable memory.

5. A content addressable memory, according to claim 1, wherein said first terminal of said fifth switching device and said first terminal of said sixth switching device are isolated from said first data line and said second data line respectively by respective transistors having first terminals thereof connected to said address line, second terminals thereof connected to said first and second data line respectively, and third terminals thereof connected to first and second inputs of said bistable memory cell.

6. A content addressable memory, according to claim 1, wherein said second switching device is turned off on a miscompare thus inhibiting the flow of DC current through said compare circuit and reducing power consumption.

7. A content addressable memory cell comprising a bistable circuit having first and second data input terminals connected to first and second data lines and an address terminal connected to an address line;
    a compare circuit connected to said bistable memory circuit, an input of said compare circuit connected to a compare line and and an output of said compare circuit connected to a match line, wherein said compare circuit further comprises:
    first and second switching devices each having a first input terminal connected to said compare line, said first switching device having a second terminal connected to a first voltage reference point, said second switching device having a second terminal connected to a second voltage reference point, said first switching device having a third terminal connected to a common junction of second terminals of third and fourth switching devices, and said second switching devices having a third terminal connected to said match line, third and fourth switching devices, each having three terminals, a first terminal of said third device connected to said second data line, a first terminal of said fourth switching device connected to said first data line, a third terminal of said third switching device connected to a second terminal of a fifth switching device, a third terminal of said fourth switching device connected to a second terminal of a sixth switching device; and fifth and sixth switching devices, each having three terminals. A first terminal of said fifth switching device connected to an input terminal of said bistable circuit associated with said first data line and isolated therefrom, a first terminal of said sixth switching device connected to an input terminal of said bistable circuit associated with said second data line and isolated therefrom, a third terminal of said fifth switching device and a third terminal of said sixth switching device connected to said match line;

wherein said memory operates with reduced power consumption, reduced data line capacitance, and with improved switching performance.

8. A content addressable memory cell, according to claim 7, wherein said first voltage reference point is at ground potential and said second voltage reference point is at an operating supply voltage potential.

9. A content addressable memory cell, according to claim 7, wherein said first, third, fourth, fifth, and sixth switching devices are N channel field effect transistors, and said second switching device is a P channel field effect transistor.

10. A content addressable memory cell, according to claim 7, wherein said first and second switching devices are shared with other compare circuits in said content addressable memory.

11. A content addressable memory cell, according to claim 7, wherein said first terminal of said fifth switching device and said first terminal of said sixth switching device are isolated from said first data line and said second data line respectively by respective transistors having first terminals thereof connected to said address line, second terminals thereof connected to said first and second data line respectively, and third terminals thereof connected to first and second inputs of said bistable memory cell.

* * * * *